(12) United States Patent
Mikhaylichenko et al.

(10) Patent No.: US 6,951,042 B1
(45) Date of Patent: Oct. 4, 2005

(54) BRUSH SCRUBBING-HIGH FREQUENCY RESONATING WAFER PROCESSING SYSTEM AND METHODS FOR MAKING AND IMPLEMENTING THE SAME

(75) Inventors: Katrina Mikhaylichenko, San Jose, CA (US); Fritz C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 76 days.

(21) Appl. No.: 10/377,944

(22) Filed: Feb. 28, 2003

(51) Int. Cl.[7] .................... A47L 25/00; B08B 3/00

(52) U.S. Cl. ................. 15/77; 15/88.2; 15/102; 15/21.1

(58) Field of Search ............... 15/77, 88.2, 88.3, 15/102, 21.1, 94, 103.5

(56) References Cited

U.S. PATENT DOCUMENTS

| | | | | |
|---|---|---|---|---|
| 5,975,094 A | * | 11/1999 | Shurtliff | 134/1.3 |
| 6,167,583 B1 | * | 1/2001 | Miyashita et al. | 15/77 |
| 6,175,983 B1 | * | 1/2001 | Hirose et al. | 15/102 |
| 6,554,010 B1 | * | 4/2003 | Hirose et al. | 134/153 |
| 2002/0092544 A1 | * | 7/2002 | Namba | 134/6 |

* cited by examiner

*Primary Examiner*—John Kim
*Assistant Examiner*—Shay L. Balsis
(74) *Attorney, Agent, or Firm*—Martine Penilla & Gencarella, LLP

(57) ABSTRACT

A substrate cleaning apparatus is provided. The apparatus includes a transducer capable of resonating at a high frequency and a brush material attached to a surface of the transducer. The brush material includes at least one passage extending to the surface of the transducer and is configured to be applied to a surface of a substrate. When the transducer resonates at the high frequency, the transducer is capable of imparting acoustic energy to the surface of the substrate at a location of the at least one passage.

20 Claims, 16 Drawing Sheets

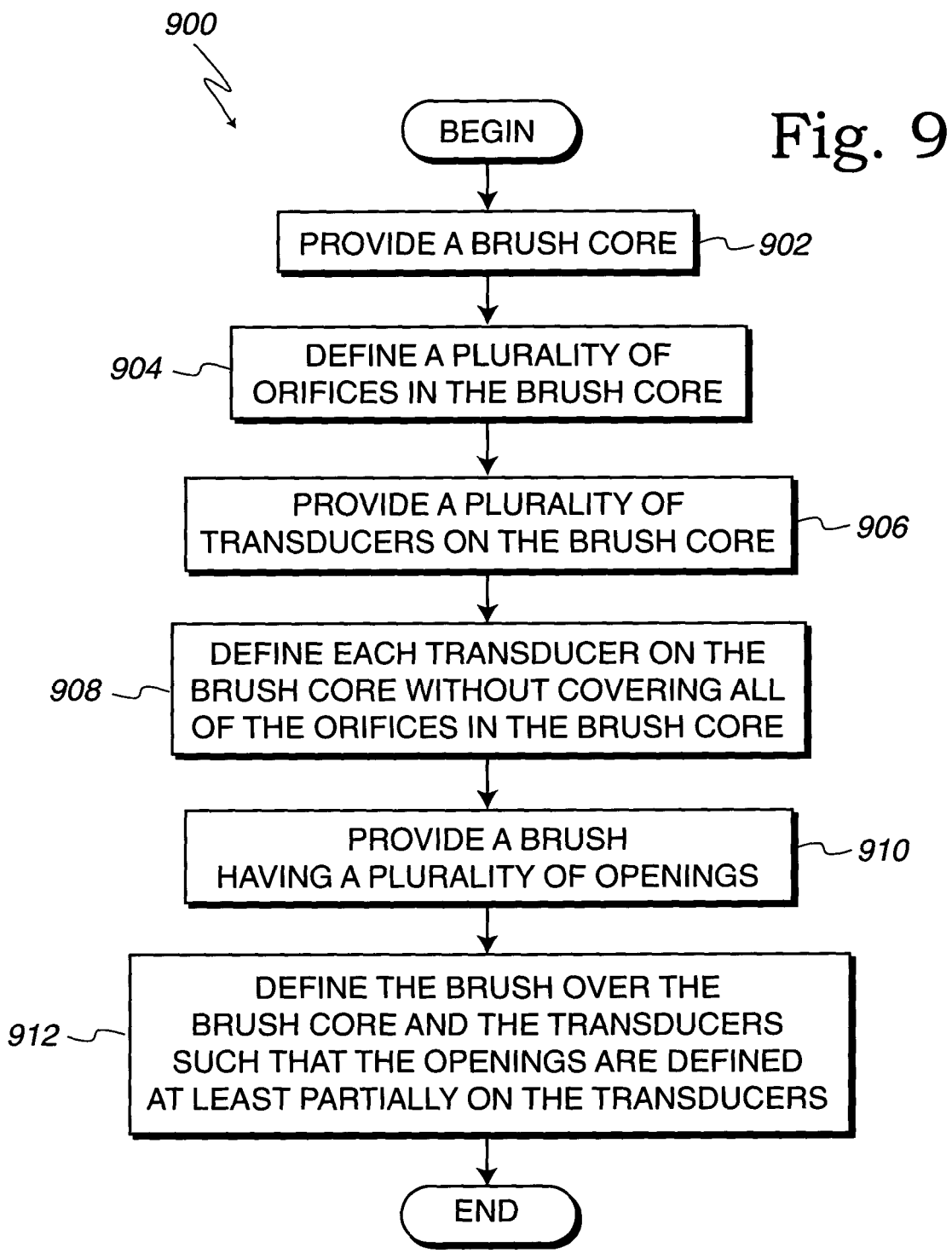

BRUSH SCRUBBING-HIGH FREQUENCY RESONATING WAFER PROCESSING SYSTEM AND METHODS FOR MAKING AND IMPLEMENTING THE SAME

BACKGROUND OF THE INVENTION

1. Field of the Invention

The present invention relates generally to substrate surface cleaning and, more particularly, to a method and apparatus for improving semiconductor substrate cleaning following fabrication processes.

2. Description of the Related Art

As is well known to those skilled in the art, the fabrication of semiconductor devices involves numerous processing operations. These operations include, for example, impurity implants, gate oxide generation, inter-metal oxide depositions, metallization depositions, photolithography patterning, etching operations, chemical mechanical polishing (CMP), etc. Typically, these operations generate contaminants such as particles, residue, or absorbed components (e.g., chemicals), which are adhered to the wafer surface and/or wafer topography features. It is well established that contaminants should be removed as the presence of such contaminants has detrimental effects on the performance of the integrated circuit devices. To achieve this task, wafer surfaces and topography features are cleaned so as to dislodge and remove contaminants.

Common cleaning operations may involve brush scrubbing of the wafer surfaces wherein the wafer surfaces are cleaned purely by applying mechanical energy. Another widely use cleaning operation involves megasonic cleaning of the wafer surfaces in order to dislodge any adhered contaminants.

The brush scrubbing operation is usually performed by either a double-sided horizontal wafer scrubber or horizontal wafer scrubber designed to clean top and bottom surfaces of a wafer. Top and bottom surfaces of the wafer are brushed by a pair of brushes, each mounted on a corresponding brush core. Each of the brush cores includes a respective shaft, each connected to a fluid inlet. The outer surfaces of the brushes are typically covered with a plurality of nodules. The wafer is engaged by a pair of rollers while the top and bottom surfaces of the wafer are scrubbed by the brushes. The wafer is cleaned as the brushes come in contact with top and bottom surfaces of the wafer, thus removing the contaminants.

FIG. 1A shows a simplified, partial, exploded, cross sectional view of an exemplary prior art brush scrubbing operation. A brush 12 having a plurality of nodules 14 is shown to be applied to the wafer surface 8' so as to clean planer surface as well as the topography features 8a–8d defined on the wafer surface 8'. As can be seen, a plurality of contaminants 10a–10f is adhered to the planer surface of the wafer surface 8' or in deep topography features 8a–8d. For instance, contaminants 10a, 10b, 10d, and 10e are adhered to the planer surface of the wafer surface 8' while contaminant 10c is adhered inside the feature 8b, and contaminant 10f is adhered inside the feature 8d.

Normally, wafer surface 8' is brush scrubbed using chemicals so as to remove any contaminants adhered to the wafer surface 8'. The wafer surface 8' is then rinsed by flushing the wafer surface 8' with DI water, thus disposing the contaminant 10a–10e. At this point, the cleaned wafer is removed from the brush scrubber, allowing the next wafer to be placed in the brush scrubber. In this fashion, each wafer is scrubbed and rinsed in the prior art brush box.

Unfortunately, brush scrubbing operations can generally only dislodge contaminants defined on planer surfaces, i.e., 10a, 10b, 10d, and 10e. This occurs as the brush materials 12 may not penetrate through very high aspect ratio features 8a–8d (e.g., trenches and vias, etc.) so as to clean contaminants 10c and 10f defined deep within the features. As a result, brush scrubbing operations may exhibit a rather poor cleaning capacity when cleaning surface topography features such as trenches or vias open to the wafer surface 8'. For instance, at the conclusion of the brush scrubbing operation, contaminants defined on the planer surface of the wafer surface (i.e., 10a, 10b, 10d, and 10e) have been removed while, in some cases, contaminants 10c and 10f may still remain adhered to the wafer surface 8'. In some circumstance, this limitation associated with brush scrubbing operations becomes more noticeable as the feature sizes get smaller (e.g., smaller than 0.2 microns). As can be appreciated, smaller feature sizes may prevent penetration of the brush material into the topography features, thus limiting or blocking access to the contaminants lodged therein.

Another commonly used cleaning operation is cleaning of wafer surface 8' using a megasonic cleaner shown in the simplified, partial, exploded, cross sectional view of FIG. 1B, in accordance with the prior art. As shown, a megasonic transducer is fabricated using a plurality of crystals 32 of piezoelectric material bonded to a resonator 30. The crystals 32 are powered, thus causing the resonator 30 to vibrate. The vibration of the high frequency acoustic energy transducer creates sonic pressure waves in the liquid medium or the meniscus present. In this manner, contaminants 10a–10f are expected to be removed by cavitation and sonic agitation generated in the high frequency acoustic energy cleaner.

Megasonic cleaning has proven to be more than reliable in cleaning and dislodging contaminants defined deep into the topography features 8a–8d defined on the wafer surface 8'. However, megasonic cleaning may achieve an inadequate cleaning of the planer surfaces. By way of example, contaminant 10c lodged deep into the feature 8b and contaminant 10f lodged into the feature 8d are easily dislodged and removed by megasonic cleaning. Contaminants 10a, 10b, 10d, and 10e, nevertheless may still remain on the wafer surface 8' subsequent to the megasonic cleaning. Furthermore, as shown, megasonic cleaning may not be capable of dislodging contaminants pressed onto the wafer surface 8', such as contaminant 10d.

In an attempt to compensate the limitations associated with either brush scrubbing or megasonic cleaning operations, typical wafer cleaning processes of the prior art involve performing cleaning operations in multiple stand alone modules in a given order. For instance, as shown in FIG. 1C, the prior art cleaning operation starts by brush scrubbing wafer surfaces in a stand alone brush box 2 for a specific period of time subsequent to which the cleaned wafer is removed from the brush box 2 and transferred into the stand alone megasonic cleaner 4. At this point, the wafer surfaces are cleaned in the stand alone megasonic cleaner 4 for a particular time after which the cleaned wafer is transferred to a spin, rinse, and dry (SRD) module 6. Next, the wafer is spin-rinsed and dried. In this fashion, each wafer is scrubbed, megasonically cleaned, and spin-rinsed in accordance with the prior art.

As can be appreciated, each wafer has to be brush scrubbed, megasonically cleaned, and spin rinsed, separately and for a corresponding period of time, in three different stand alone modules, thus making the cleaning process of the prior art an extended and lengthy process. Prolonging the cleaning period even more is the transition time necessary for removing and transferring of wafers between the stand alone modules. In this manner, the cleaning cycle for each wafer is significantly and unnecessarily increased. As can be appreciated, this reduces the overall wafer throughput.

In view of the foregoing, a need therefore exists in the art for a method and apparatus capable of producing a substantially clean patterned and/or unpatterned semiconductor substrate, while maximizing cleaning efficiency and minimizing semiconductor substrate cleaning cycle.

SUMMARY OF THE INVENTION

Broadly speaking, the present invention fills this need by providing a system for cleaning semiconductor substrates by concurrently using a combination of high frequency acoustic energy cleaning and brush scrubbing in a stand alone cleaning module or clustered with other modules. It should be appreciated that the present invention can be implemented in numerous ways, including as a process, an apparatus, a system, a device, or a method. Several inventive embodiments of the present invention are described below.

In one embodiment, a substrate cleaning apparatus is provided. The apparatus includes a transducer capable of resonating at a high frequency and a brush material attached to a surface of the transducer. The brush material includes at least one passage extending to the surface of the transducer and is configured to be applied to a surface of a substrate. When the transducer resonates at the high frequency, the transducer is capable of imparting acoustic energy to the surface of the substrate at a location of the at least one passage.

In another embodiment, a substrate cleaner is provided. The substrate cleaner includes a transducer that includes a first side and a second side, a brush, a housing, and an arm. The brush is disposed on the first side of the transducer and is configured to include a plurality of openings. The plurality of openings is configured to facilitate transmission of high frequency acoustic energy imparted by the transducer to a surface of a substrate at a respective location of each opening of the plurality of openings. The housing is configured to cover the brush and the transducer and an arm coupled to a backside of the housing. The arm is configured to controllably apply the brush disposed on the transducer onto the surface of the substrate.

In yet another embodiment, a brush scrubbing-high frequency acoustic energy (AE) cleaning system is provided. The system includes a brush core having a first end, a second end, and an outer surface, a shaft, a fluid inlet, a transducer, and a brush. The brush core includes a plurality of orifices extending from a center of the brush core to the outer surface of the brush core. The shaft is connected to the first end of the brush core. The fluid inlet is configured to deliver a fluid medium to the brush core through the shaft. The transducer is disposed on an outer surface of the brush core and is capable of resonating at a high frequency. The brush includes a plurality of openings and is configured to cover the transducer. When the transducer resonates at the high frequency, high energy acoustic energy is imparted from the transducer to a surface of a substrate at respective locations of each of the plurality of openings.

In still another embodiment, another brush scrubbing-high frequency acoustic energy (AE) cleaning system is provided. The system includes a brush core having a first end, a second end, and an outer surface, a shaft, a transducer, and a brush. The shaft is connected to the first end of the brush core. The transducer is disposed on an outer surface of the brush core and is capable of resonating at a high frequency. The brush includes a plurality of openings and is configured to cover the transducer. When the transducer resonates at the high frequency, high energy acoustic energy is imparted from the transducer to a surface of a substrate at respective locations of each of the plurality of openings.

In still another embodiment, a method for making a brush scrubbing-high frequency acoustic energy cleaning assembly is provided. The method includes making a plurality of orifices in a brush core. The method also includes disposing a plurality of transducers on an outer surface of the brush core such that a subset of the plurality of orifices in the brush core is exposed to a brush. The plurality of transducers is capable of resonating at a high frequency. Also included is making a plurality of openings in the brush and placing the brush over the plurality of transducers such that the plurality of transducers is exposed to a subset of the plurality of openings in the brush. When the transducer resonates at the high frequency, high energy acoustic energy is imparted from the plurality of transducer to a surface of a substrate at respective locations of each of the plurality of openings.

In yet another embodiment, a method for making a brush scrubbing-high frequency acoustic energy cleaning assembly is provided. The method includes disposing a plurality of transducers on an outer surface of a brush core and making a plurality of openings in a brush. The method further includes covering the brush over the plurality of transducers such that the plurality of transducers is exposed to a subset of the plurality of the openings in the brush core.

In still another embodiment, a method for making a brush scrubbing-high frequency acoustic energy (AE) cleaning assembly is provided. The method includes making an opening in a brush. The opening extends through the brush. The method also includes disposing the brush over a transducer capable of resonating at a high frequency. When the transducer resonates at the high frequency, high energy acoustic energy is imparted from the transducer to a surface of a substrate at a location of the opening.

The advantages of the present invention are numerous. Most notably, the embodiments of the present invention concurrently utilize brush scrubbing and high frequency acoustic energy cleaning, thus achieving a substantially improved cleaning operation. Another advantage of the present invention is that performing of brush scrubbing-AE cleaning in a single cleaning module enhances the substrate cleaning efficiency. Another advantage of the embodiments of the present invention is that by concurrently performing brush scrubbing and AE cleaning, the cleaning cycle per wafer is substantially reduced, ultimately leading to an increase in wafer throughput. Still another advantage of the present invention is that single semiconductor wafers can be cleaned substantially eliminating the possibility of recontamination of the wafer by contaminants set free during the cleaning of other semiconductor wafers. Yet another advantage of the present invention is that in the cleaning module of the present invention the cleaning operation can easily be switched between contact cleaning (brush scrubbing), non-contact cleaning (AE cleaning), or contact-noncontact cleaning, depending on the application requirements. Yet another advantage is that the embodiments of the present invention can be implemented in a multi-station cleaning module designed to clean a plurality of substrates in individual combination cleaning modules.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 9 is a flowchart diagram of method operations performed in making a roller-type brush scrubbing-AE cleaning assembly, in accordance with yet another embodiment of the present invention.

DETAILED DESCRIPTION OF THE PREFERRED EMBODIMENTS

Figure 1A:
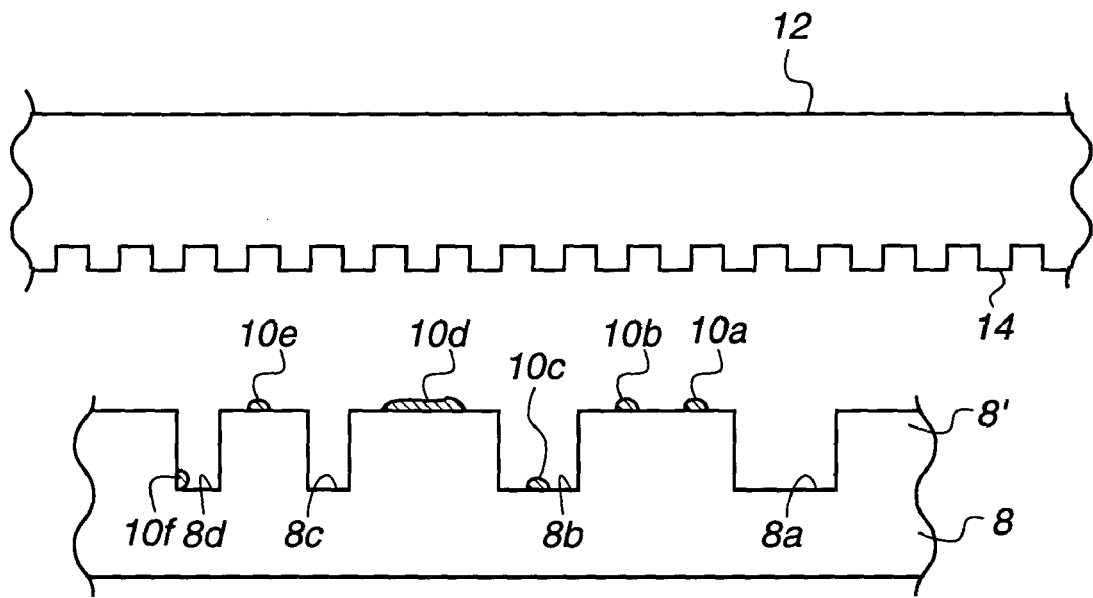
FIG. 1A shows a simplified, partial, exploded, cross sectional view of an exemplary prior art brush scrubbing operation.
Figure 1B:
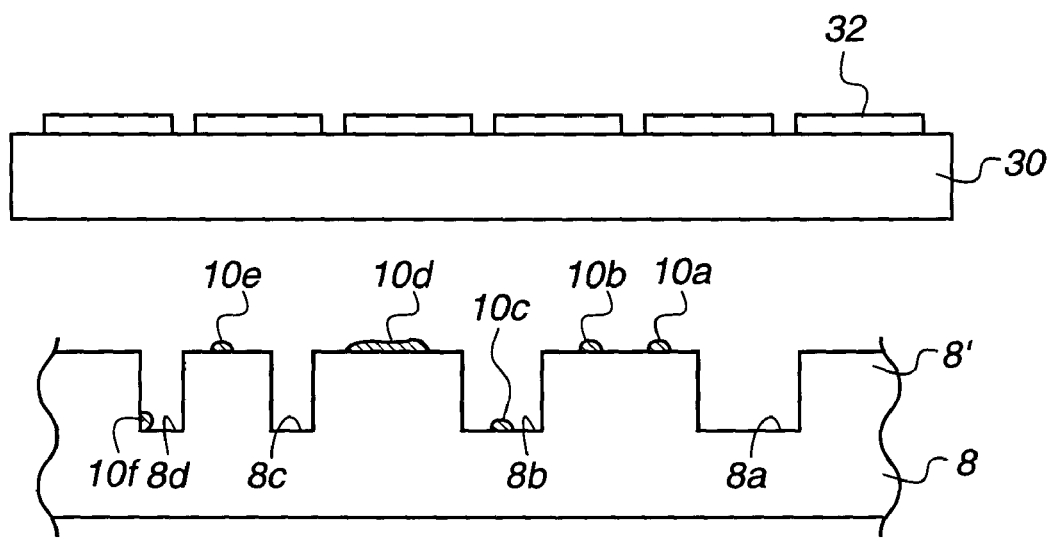
FIG. 1B shows a simplified cross sectional view of an exemplary prior art megasonic cleaning.
Figure 1C:
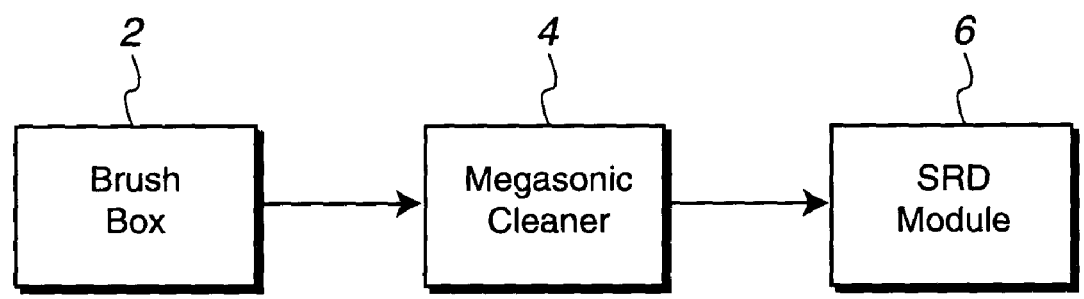
FIG. 1C shows a simplified schematic diagram illustrating cleaning modules implemented in a prior art cleaning operation.

Several exemplary embodiments of the invention will now be described in detail with reference to the accompanying drawings. FIGS. 1A, 1B, and 1C are discussed above in the "Background of the Invention" section.

The embodiments of the present invention provide an apparatus and a method for cleaning a semiconductor substrate by concurrently using a combination of high frequency acoustic energy cleaning and brush scrubbing in a stand alone cleaning module. In one embodiment, a brush scrubbing-high frequency acoustic energy cleaning assembly capable of substantially removing contaminants lodged on wafer planer surfaces or deep wafer topography features. In one embodiment, a flat brush scrubbing-acoustic energy (AE) cleaning assembly is provided. The flat brush scrubbing-AE cleaning assembly includes a housing, a transducer having a crystal bonded to a resonator, and an arm configured to move the housing and thus the flat brush scrubbing-AE cleaning assembly. A flat brush having a plurality of openings functioning as AE passageways are defined in the brush. In another embodiment, a roller-type brush scrubbing-AE cleaning assembly is provided. The roller-type brush scrubbing-AE cleaning assembly includes a plurality of transducers defined on the outer surface of a brush core. In such an embodiment, each pair of adjacent transducers can be separated by a portion of the brush material. In one embodiment, fluid medium is introduced onto the wafer surfaces through the brush. In another embodiment, fluid medium is dripped onto the wafer surface through a nozzle.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
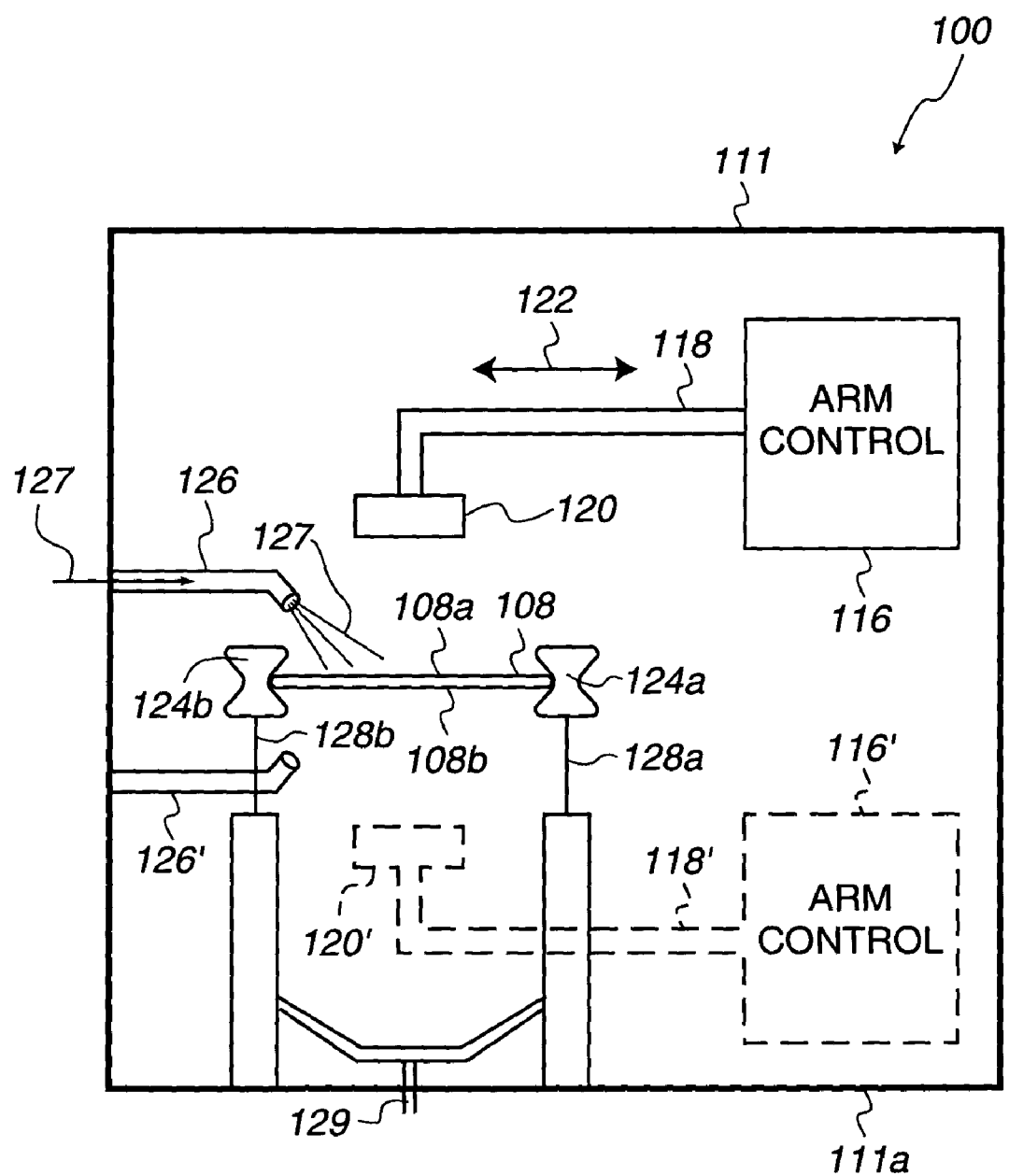
FIG. 2A is a simplified cross sectional view of an exemplary cleaning module, in accordance with one embodiment of the present invention.

FIG. 2A is a simplified cross sectional view of an exemplary cleaning module 100, in accordance with one embodiment of the present invention. A chamber 111 of the cleaning module 100 is shown to include a flat (i.e., pancake) brush scrubbing-AE assembly 120, an arm 118, a nozzle 126, and a wafer 108 engaged by a pair of rollers 124a and 124b. The flat brush scrubbing-AE assembly 120 is connected to an arm control module 116 by an arm 118. The arm 118 is configured to move in a movement direction 122, thus causing the flat brush scrubbing-AE cleaning assembly 120 to scan the wafer top surface in the movement direction 122 during the brush scrubbing-AE cleaning operation. In this manner, in one embodiment, maximized wafer coverage and averaging of cleaning efficiency can be achieved by scanning the flat brush scrubbing-AE cleaning assembly 120 from the center of the wafer 108 to the edge of the wafer 108. Fluid medium 127 is introduced onto the wafer surface through the nozzle 126.

As can be appreciated, in one embodiment, the flat brush scrubbing-AE cleaning assembly may be configured to symmetrically clean the wafer backside. In such an implementation, the chamber 111 further includes a second brush scrubbing-AE assembly 120' connected to a second arm control module 116' using an arm 118'. The wafer backside 108b is cleaned as the second brush scrubbing-AE assembly 120' scans the wafer backside in the movement direction 122. A fluid medium 127' is introduced into the cleaning interface using a second nozzle 126'.

As can be seen, the wafer 108 is engaged by the rollers 124a and 124b during the cleaning operation. The rollers 124a and 124b are respectively placed in the chamber 111 using corresponding spindles 128a and 128b of a chuck. In one example, the rollers 124a and 124b are configured to rotate, thus causing the wafer 108 to rotate during the cleaning operation. In another embodiment, the cleaning module 100 may include a third roller (not shown in FIG. 2A). In such example, the third roller is configured to rotate while the rollers 124a and 124b are designed to remain stationary. The rotation of the third roller is configured to cause the wafer 108 to rotate during the cleaning operation. In one example, the cleaning efficiency is averaged by rotating the wafer 108 and/or the brush scrubbing-AE cleaning assembly 120 and 120'.

Figure 2B:
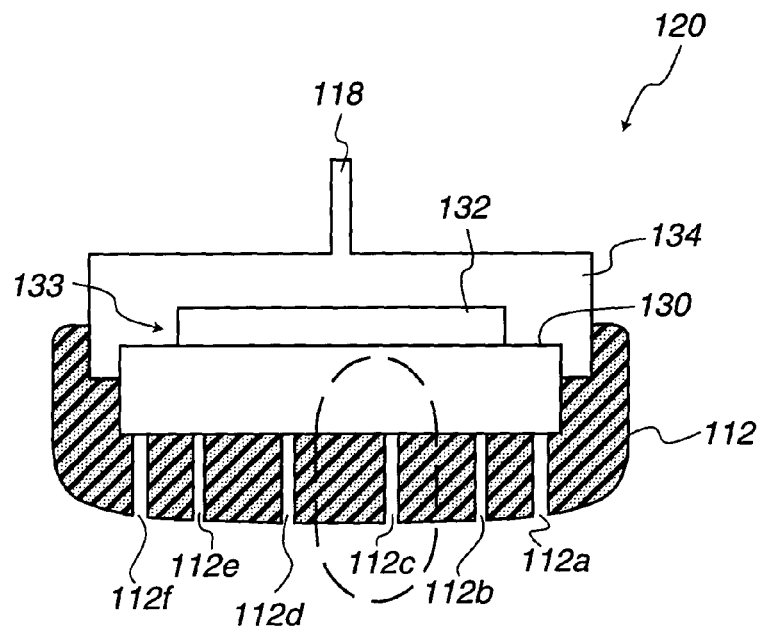
FIG. 2B is a simplified, exploded, cross sectional view of an exemplary flat brush scrubbing-AE cleaning assembly, in accordance with one embodiment of the present invention.

Reference is made to a simplified, exploded, cross sectional view of an exemplary flat brush scrubbing-AE cleaning assembly 120 shown in FIG. 2B, in accordance with one embodiment of the present invention. As shown, a transducer 133 includes a crystal 132 bonded to a resonator 130 defined in a housing 134. In one example, the crystal 132 is a piezoelectric crystal. The crystal is shown to be defined on a backside of the resonator 130, facing away from the wafer 108 to be cleaned.

A brush 112 is shown to be placed on the face of the resonator 130. In one example, as shown in the embodiment of FIG. 2B, the brush 112 covers the sidewalls of the resonator 130 and portions of the resonator 130 sidewalls. A plurality of openings 112a–112f defined in the brush 112 is configured to function as AE passageways and facilitate the transmission of acoustic energy onto the wafer surface.

Figure 2C:
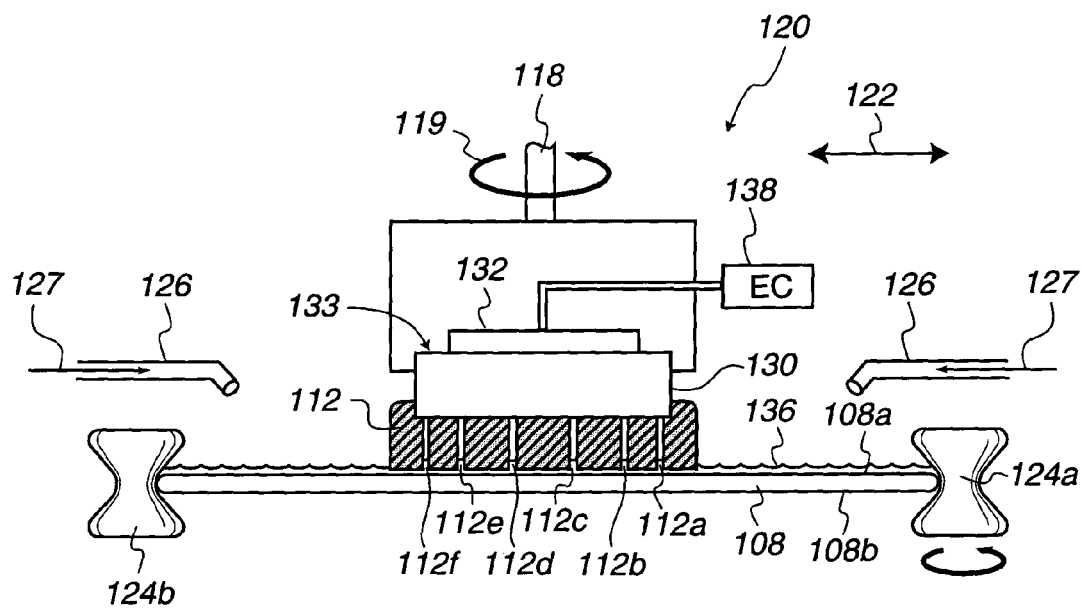
FIG. 2C is a simplified cross sectional view illustrating cleaning of the wafer top surface by an exemplary brush scrubbing-AE cleaning assembly, in accordance with another embodiment of the present invention.

FIG. 2C is a simplified cross sectional view illustrating cleaning of the wafer top surface 108a by an exemplary brush scrubbing-AE cleaning assembly 120, in accordance with one embodiment of the present invention. The brush 112 is shown to be applied onto the wafer top surface 108a while the crystal 132 is powered by the electrical connection module 138. In this manner, the electrical connection is used to apply power to the transducers. As shown, the plurality of openings 112a–112f faces the wafer top surface 108a during the brush scrubbing-AE cleaning operation.

In the embodiment shown in FIG. 2C, the flat brush scrubbing-AE cleaning assembly 120 scans the top surface 108a of the wafer 108 in the movement direction 122 while rotating in a rotation direction 119. In this manner, the brush scrubbing-assembly 120 can be implemented to clean almost the entire wafer top surface 108a. In one embodiment, a diameter of the transducer 133 can be smaller than the diameter of the wafer 108. In another embodiment, the diameter of the transducer 133 can be substantially equivalent to the diameter of the wafer 108 or be slightly larger than the diameter of the wafer 108.

The fluid medium 127 is shown to be introduced onto the wafer top surface 108a through nozzles 126a and 126b creating a layer of meniscus 136 on the wafer top surface 108a. In this manner, the brush 112 is saturated with fluid medium 127 as the fluid medium 127 is applied to the wafer top surface 108a. In one preferred embodiment, the fluid medium 127 and thus the meniscus 136 propagate into the openings 112–112f. In this manner, the fluid medium 127 defined in the exemplary openings 112a–112f is implemented to transmit high frequency acoustic energy imparted by the resonator to the wafer top surface 108 during the cleaning operation.

One having ordinary skill in the art must appreciate that any suitable number of nozzles can be implemented to introduce the fluid medium 127 onto the wafer surfaces. Furthermore, in one example, the mechanical energy created to clean the wafer surfaces is created by the linear velocity of the brush scrubbing-cleaning assembly and the wafer. For instance, linear velocity can be created by rotating brush scrubbing-cleaning assembly, rotating brush scrubbing-cleaning assembly and scanning the wafer surface using the brush scrubbing-cleaning assembly, or rotating the wafer. For instance, as the wafer 108 rotates, the fluid medium introduced onto the wafer surface is spread on the wafer surface due to the centrifugal force, thus causing the fluid medium to be substantially evenly distributed on the wafer surface. In one embodiment, the wafer is configured to rotate approximately about 1 and 200 RPMs, and a more preferred range of approximately about 5 and 50 RPMs and most preferably approximately about 5 RPMs during the cleaning operation. In another embodiment, the brush scrubbing-cleaning assembly can be configured to linearly move back and forth on the wafer surface while the wafer 108 rotates.

In one exemplary embodiment, the vibration of the high frequency acoustic energy transducer 133 creates sonic pressure waves in the fluid medium 127 defined in the openings 112a–112f as well as the meniscus 136. As the transducer 133 scans across the wafer 108 using the fluid medium 127, the contaminants are removed by cavitation and sonic agitation generated by the high frequency acoustic energy.

Figure 2D:
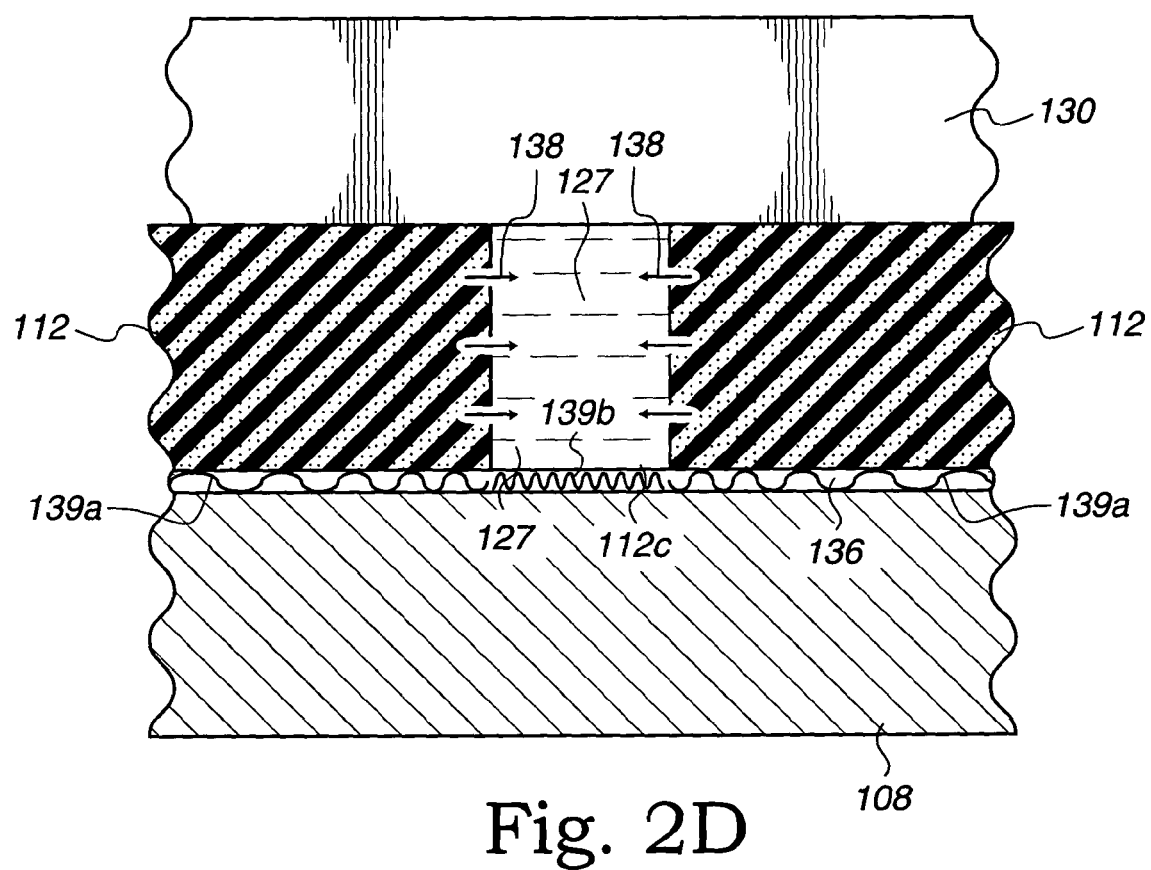
FIG. 2D is an exploded, simplified, cross sectional view of a portion of the flat brush of the brush scrubbing-AE cleaning assembly, in accordance with one embodiment of the present invention.

FIG. 2D is an exploded, simplified, cross sectional view of a portion of the flat brush of the brush scrubbing-AE cleaning assembly 120, in accordance with one embodiment of the present invention. As can be seen, fluid medium 127 substantially fills the opening 112c. In one embodiment, the brush 112 is saturated with the fluid medium 127 as the fluid medium 127 is continuously introduced onto the wafer top surface 108a and the cleaning interface. In this manner, once the brush 112 is applied onto the wafer top surface 108 with pressure, excess fluid medium 127 is squeezed out of the brush 112 in a direction 138 and into the opening 112c, substantially filling the opening 112c. As a result, the wafer top surface 108a is concurrently cleaned by both mechanical action as well as high frequency acoustic energy imparted by the resonator. For instance, the portions of the brush 112 surrounding the opening 112c are applied to the wafer top surface 108a, cleaning the wafer top surface 108a as shown the mechanical energy 139a. In comparison, the portion of the wafer top surface 108a defined beneath the opening 112c is cleaned using the high frequency acoustic energy 139b. Of course, as the brush scrubbing-AE cleaning assembly 120 rotates and scans the wafer top surface 108a, each section of the wafer top surface 108a is most likely exposed to both, the high frequency acoustic energy as well as mechanical action. In this manner, limitations associated with separately performing brush scrubbing and AE cleaning in different brush scrubbing modules and AE cleaning modules are eliminated.

In one embodiment, sonic agitation subjects the fluid medium 127 to acoustic energy waves. In one example, the acoustic energy waves are configured to occur at frequencies between approximately about 0.4 Megahertz (MHz) and about 1.5 MHz, inclusive. In one implementation, the sonic agitation can have a frequency of between approximately about 400 kHz to about 2 MHz. By way of example, in typical implementations, the megasonic energy ranges typically between approximately about 700 kHz to about 1 MHz. For instance, lower frequencies can be used for cleaning applications in the ultrasonic range, which are used mainly for part cleaning. However, preferably, the higher frequencies are used to clean wafers and semiconductor substrates, substantially reducing the possibility of damage to the substrates, which is known to occur at the lower frequencies.

In one embodiment, the top and bottom transducers 133 and 133' are configured to create acoustic pressure waves through sonic energy with frequencies approximately about 1 Megahertz. In this manner, the brush scrubbing and AE cleaning are performed simultaneously and in concert, each augmenting the cleaning power of the other.

In one example, high frequency acoustic energy originating from the top or bottom transducers 133 and 133' is respectively transmitted through top and bottom resonators 130 and 130'. Thereafter, the top and bottom resonators 130 and 130' propagate the acoustic energy to the top and bottom surfaces 108a and 108b of the wafer 108.

It must be appreciated that the performance of the transducer is determined by the material properties of the piezoelectric crystals as well as the bonding method of the crystal 132 to the resonator 130. The piezoelectric crystal 132 can be made of any appropriate piezoelectric material (e.g., piezoelectric ceramic, lead zirconium tintanate, piezoelectric quartz, gallium phosphate, etc.). In a like manner, the resonators 130 can be made of any appropriate material (e.g., ceramic, silicon carbide, stainless steel, aluminum, quartz, etc.). In one preferred embodiment, the resonator 130 is constructed from a material that is compatible with the cleaning chemistries (i.e., fluid medium) used. In another embodiment, the resonator 130 can be protected from the fluid medium a coating.

One having ordinary skill in the art must further appreciate that a thickness of the crystal 132 depends on the design of the crystal, mechanical strength of the crystal material, and type of crystal material. In one example, the thickness of the crystal 132 is configured to range between approximately about 1 mm and approximately about 6 millimeter, and a more preferred range of approximately about 2 mm and approximately about 4 mm and most preferably between approximately about 1 mm to approximately about 2 millimeters. In one embodiment, wherein the crystals are ceramic type crystals, the thickness of the crystals 132 is configured to range between approximately about 1 to about 4 millimeters.

Figure 3A:
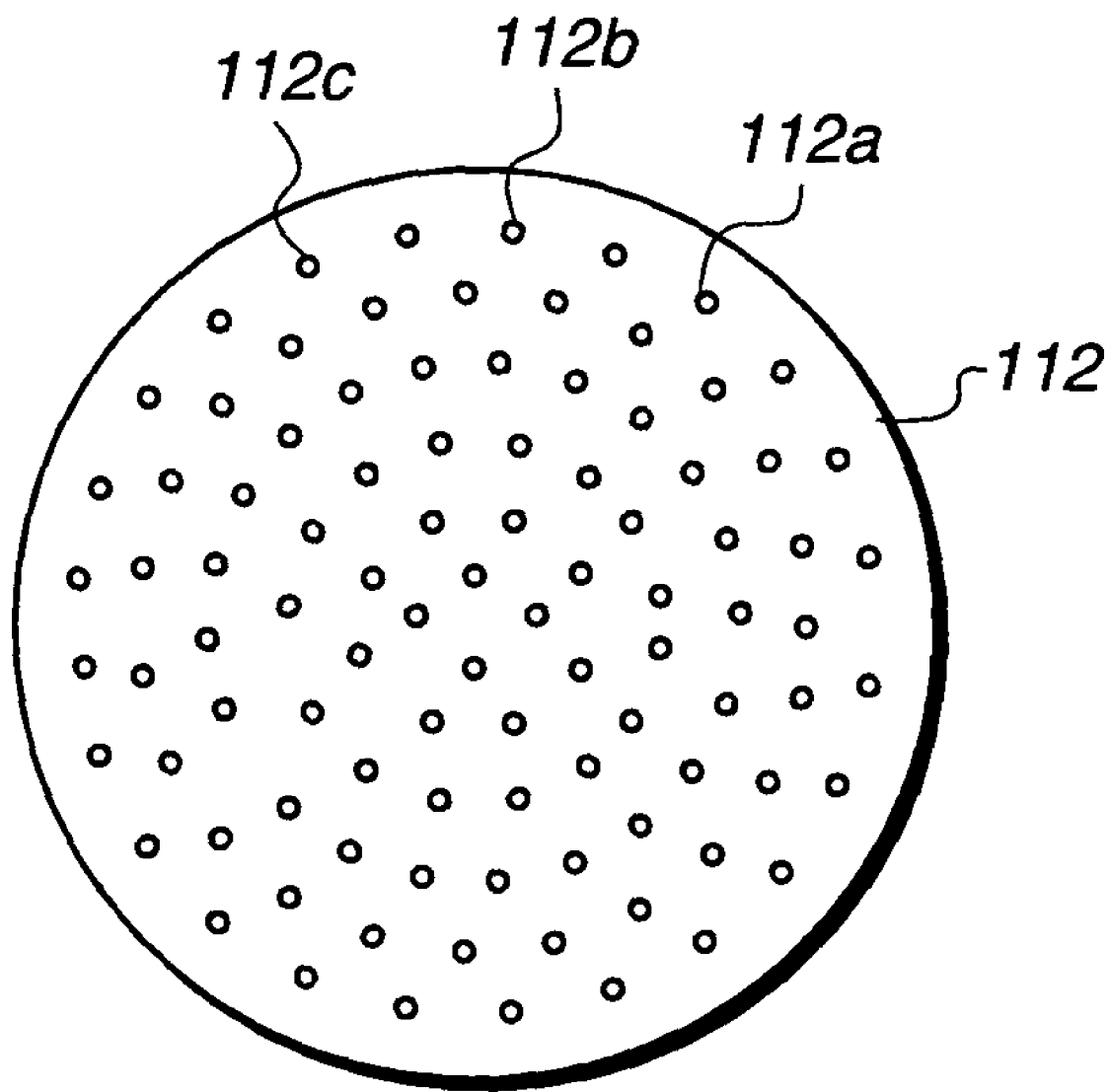
FIG. 3A is a simplified bottom view of an exemplary circular-shaped flat brush scrubbing-AE cleaning assembly, in accordance with another embodiment of the invention.
Figure 3B:
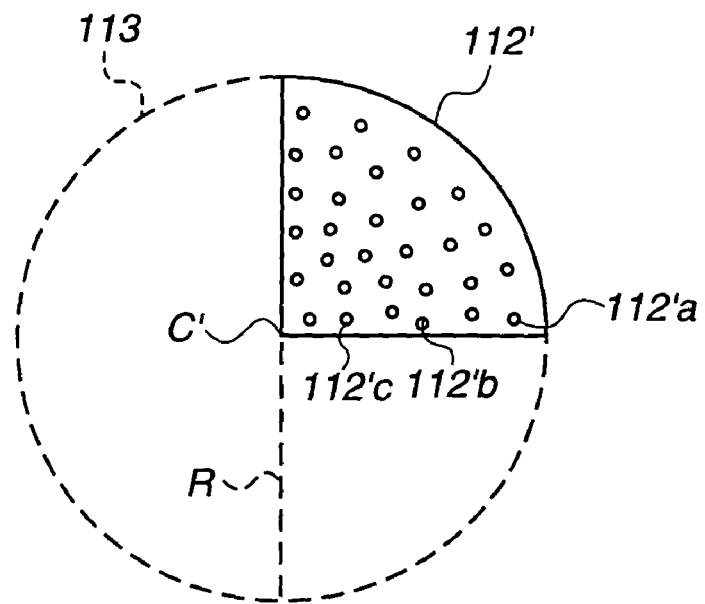
FIG. 3B is a simplified bottom view of an exemplary quarter-arc flat brush scrubbing-AE cleaning assembly, in accordance with yet another embodiment of the invention.
Figure 3C:
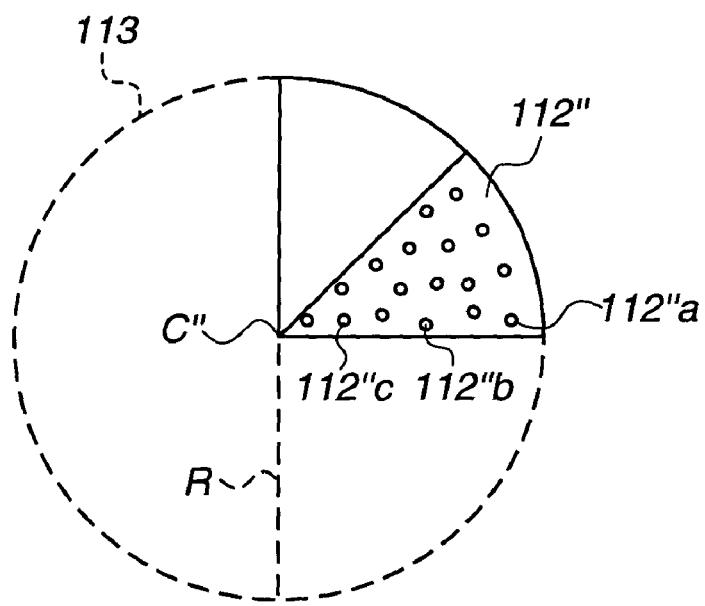
FIG. 3C is a simplified bottom view of an exemplary eight-arc flat brush scrubbing-AE cleaning assembly, in accordance with still another embodiment of the invention.

FIGS. 3A through 3C are simplified bottom views of exemplary flat brush scrubbing-AE cleaning assemblies, in accordance with several embodiments of the present invention. The flat brush scrubbing-AE cleaning assembly of FIG. 3A has a circular-shaped brush, wherein the brush 112 includes a plurality of openings such as 112a–112c. In one embodiment, a size of the circular shaped brush 112 can be substantially equivalent to the size of the semiconductor substrate while in another embodiment, the size of the circular shaped brush 112 can be different than the size of the semiconductor substrate.

In one embodiment, the openings are configured to occupy a substantial portion of the brush so as to allow undisturbed transfer of high frequency acoustic energy. In one embodiment, the openings occupy between approximately about 10 and approximately about 80, and a more preferred range of approximately about 20 and approximately about 70 and most preferably approximately about 50% of the brush surface.

The brush 112' of FIG. 3B is shown to have the shape of a quarter-arc length of a circle 113 while the embodiment 112" shown in FIG. 3C has the shape of an eight-arc length of a circle 113, wherein a radius R of the circle 113 is equivalent to a radius of the wafer 108. As can be appreciated, in one preferred embodiment, the brush 112' of the flat brush scrubbing-AE cleaning assembly 120 of FIG. 3B is designed such that the brush scrubbing-AE cleaning assembly 112' covers, at least partially, a center C' of the assembly 112'. In a like manner, brush 112" of the brush scrubbing-AE cleaning assembly 120 of FIG. 3C is designed such that the brush 112" covers, at least partially, a center C" of the assembly 112". In this manner, the centers C' and C" are substantially cleaned despite the brushes 112' and 112" having smaller sizes than the wafer 108. As can be appreciated, the brushed 112' and 112" are shown to include the plurality of exemplary openings 112'a–c and 112"a–112c", respectively. One of ordinary skill in the art must appreciate that the brushes 112' and 112" can be configured to remain stationary, to rotate, or to rotate and scan while cleaning the wafer top surface 108. Furthermore, one having ordinary skill in the art must appreciate that the brush-transducers of the present invention can be configured to have any appropriate shape.

Figure 4:
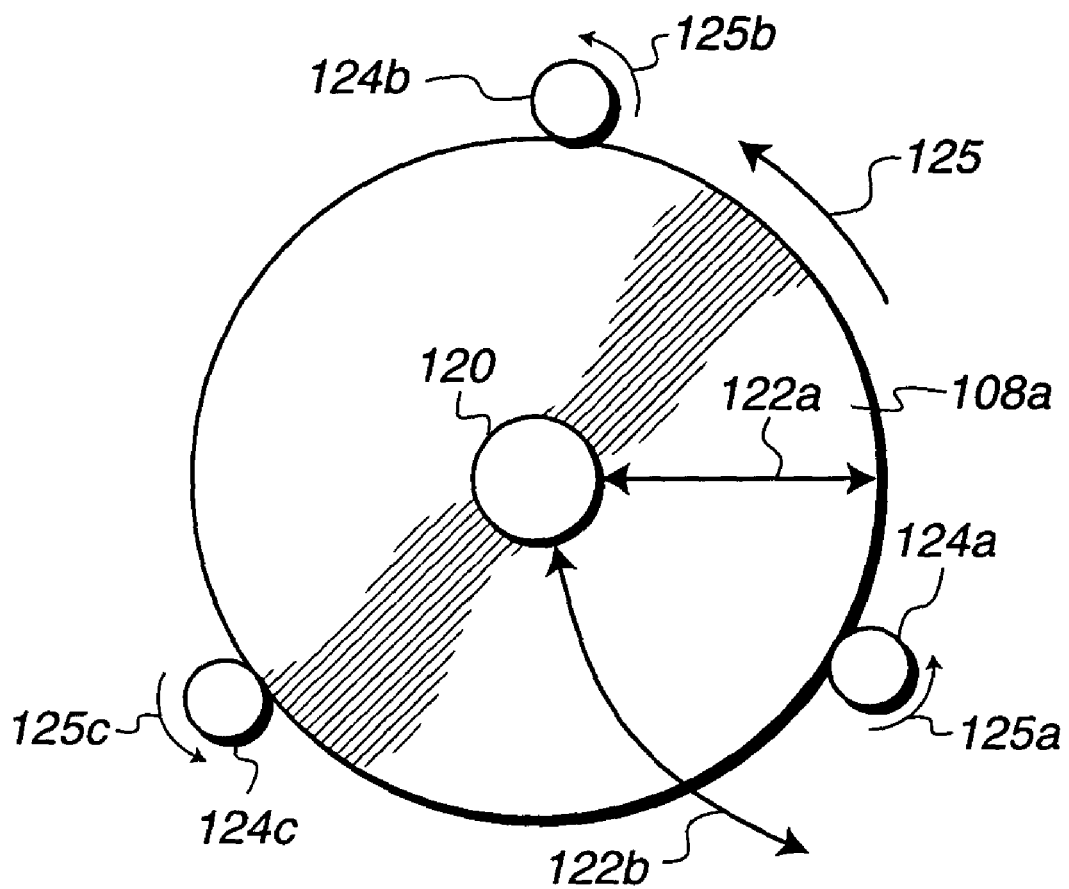
FIG. 4 is a simplified top view of an exemplary flat brush scrubbing-AE cleaning assembly cleaning a wafer top surface, in accordance with still another embodiment of the invention.

FIG. 4 is a simplified top view of an exemplary flat brush scrubbing-AE cleaning assembly 120 cleaning a wafer top surface 108, in accordance with another embodiment of the present invention. As shown, the wafer 108 is engaged with three rollers 124a–124c, each rotating in a respective rotation direction 125a, 125b, and 125c. The rotation of the driving roller 124a is designed to cause the wafer 108 to rotate in the rotation direction 125. The flat brush scrubbing-AE assembly 120 is shown to clean the wafer top surface 108a as the assembly 120 moves over the wafer top surface 108a. In one embodiment, the assembly 120 can scan over the wafer top surface 108a in a linear direction 122a while in a different embodiment, the assembly is configured to move in a radial direction 122b. The assembly 120 of the present invention can be implemented to clean substantially the entire wafer top surface 108a, even the edge of the wafer 108 being engaged by the rollers 124a–124c. In this manner, the brush scrubbing-cleaning assembly can thus be moved onto the wafer surfaces horizontally through the spaces defined between adjacent rollers.

In one exemplary embodiment, the wafer surface is cleaned by changing the liner velocity of the brush scrubbing-cleaning assembly, as the brush scrubbing-cleaning assembly is cleaning the center of the surface versus the edge of the wafer. For instance, the liner velocity of the brush scrubbing-cleaning assembly can be configured to be reduced as the brush scrubbing-cleaning assembly moves from the center of the wafer to the edge of the wafer. In one embodiment, the arm control defines the applied pressure, velocity, and trajectory. For instance, in one embodiment, the brush 212 can have a thickness between approximately about 0.25 and 0.5 inch. In such embodiment, the compression of the brush 212 can be between approximately about 0.5 mm and approximately about 14 mm, and a more preferred range of approximately about 1 mm and approximately about 10 mm and most preferably approximately about 2 and approximately about 3 mm.

Figure 5A:
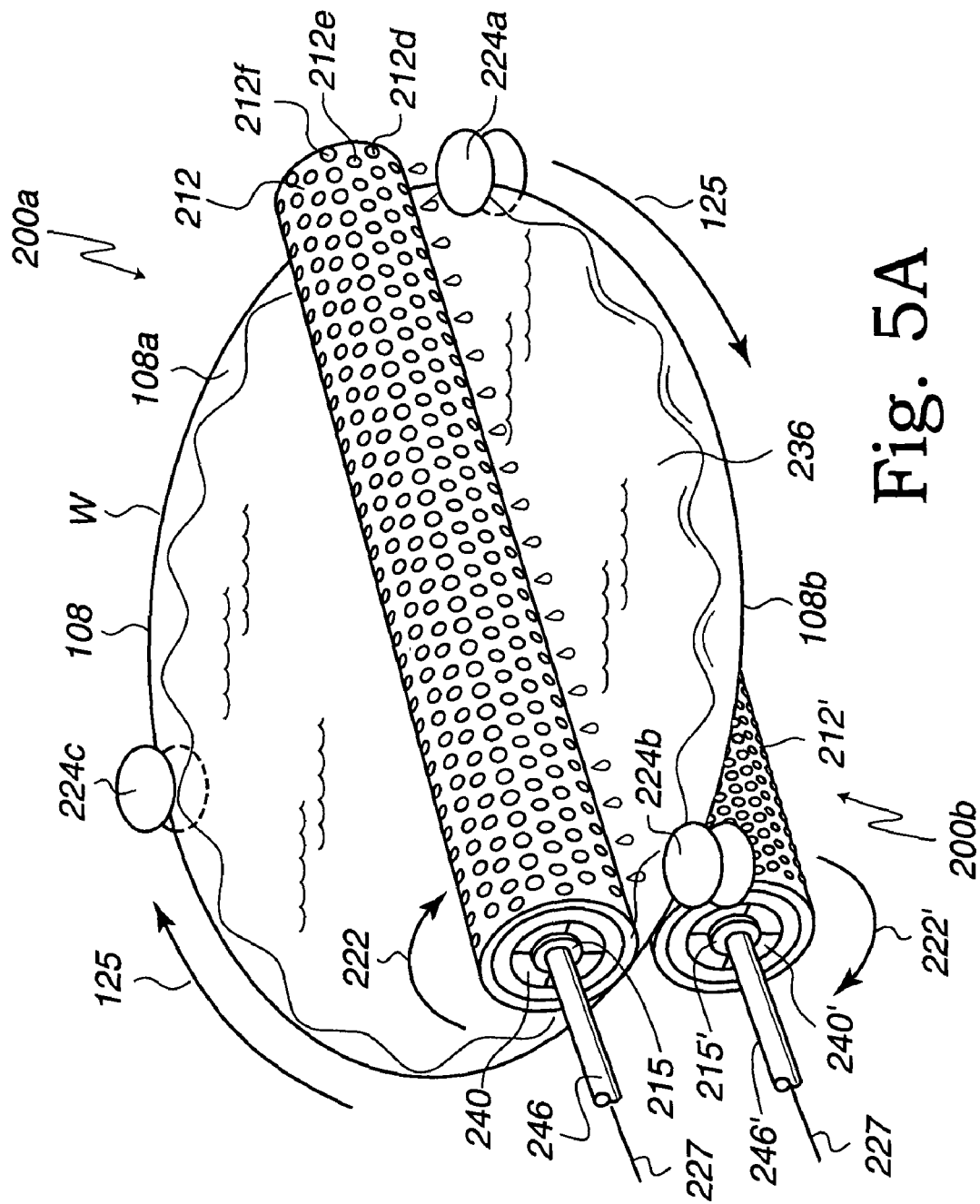
FIG. 5A is a simplified three-dimensional view of a pair of exemplary roller-type brush scrubbing-AE cleaning assemblies, in accordance with one embodiment of the invention.

FIG. 5A is a simplified three-dimensional view of a pair of exemplary roller-type brush scrubbing-AE cleaning assemblies 200a and 200b, in accordance with one embodiment of the present invention. As shown, the top roller-type brush scrubbing-AE cleaning assembly 200a includes a top brush 212 mounted on a top brush core 240 that includes a top shaft 215 connected to a top fluid inlet 246. As shown, the surface of top brush 212 is covered by a plurality of openings such as 212a–212d. The top brush 212 is shown to be rotating in a rotation direction 222 as the rollers 224a–224c rotate, thus causing the wafer 108 to rotate in the direction 125.

In one example, the wafer 108 can be engaged by two engaging rollers 224a and 224b and a driving roller 224c. As can be seen, during the brush scrubbing-AE cleaning operation, the wafer 108 is held horizontally by the engaging rollers 224a and 224b and the driving roller 224b and top brush 212. In such an embodiment, the wafer 108 is rotated in the wafer rotation direction 125 by the driving roller 224c.

In accordance with one implementation, the backside of the wafer 108 can be cleaned using a bottom roller-type brush scrubbing-AE cleaning assembly 200b. Similar to the top roller-type assembly 200a, the bottom roller-type brush scrubbing-AE cleaning assembly 200b includes a bottom brush 212' mounted on a bottom brush core 240' that includes a bottom shaft 215' connected to a bottom fluid inlet 246'. The surface of the bottom brush 212' is shown to be covered by a plurality of openings such as 212'a–212'd. The bottom brush 212' is shown to be rotating in a rotation direction 222' as the wafer is rotated in the direction 125.

As can be seen, top and bottom brushes 212 and 212' are configured to rotate around an axis of rotation in respective rotation directions 222 and 222'. In this manner, top and bottom surfaces of the wafer 108 are cleaned as top and bottom brushes 212 and 212' come into contact with top and bottom surfaces 108a and 108b, applying equal but opposite forces to the wafer top and bottom surfaces 108a and 108b, respectively. Additional information with respect to the mechanism of the roller-type brush scrubbing-AE cleaning assemblies 200a and 200b are provided below with respect to FIGS. 5B–5D.

In one embodiment, top and bottom brushes 212 and 212' are polyvinyl alcohol (PVA) brushes (i.e., a very soft sponge), which can dislodge contaminants such as particles and residues using the fluid medium. In must be noted, however, that in another example, top and bottom brushes 212 and 212' can be constructed from any suitable material so long as the material can dislodge particles and residues remaining on top and bottom surfaces of the wafer 108.

In one embodiment, top and bottom surfaces 108a and 108b are cleaned using de-ionized water or any aqueous or semi-aqueous chemical solution. It must be appreciated by one having ordinary skill in the art that the fluid medium 227 can be any suitable fluid medium capable of cleaning top and bottom surfaces of the wafer and transmitting high frequency acoustic energy (e.g., Standard Cleaning I (SC1), DI water, ammonia containing chemical mixtures, HF containing chemical mixtures, surfactant containing chemical mixtures, etc.). In one implementation, the scrubbing-AE cleaning fluid medium 227 may be a cleaning fluid as described in U.S. Pat. No. 6,405,399, issued on Jun. 18, 2002, having inventors Jeffrey J. Farber and Julia S. Svirchevski, and entitled "Method and System of Cleaning a Wafer After Chemical Mechanical Polishing or Plasma Processing." This U.S. Patent, which is assigned to Lam Research Corporation, the assignee of the subject application, is incorporated herein by reference.

Figure 5B:
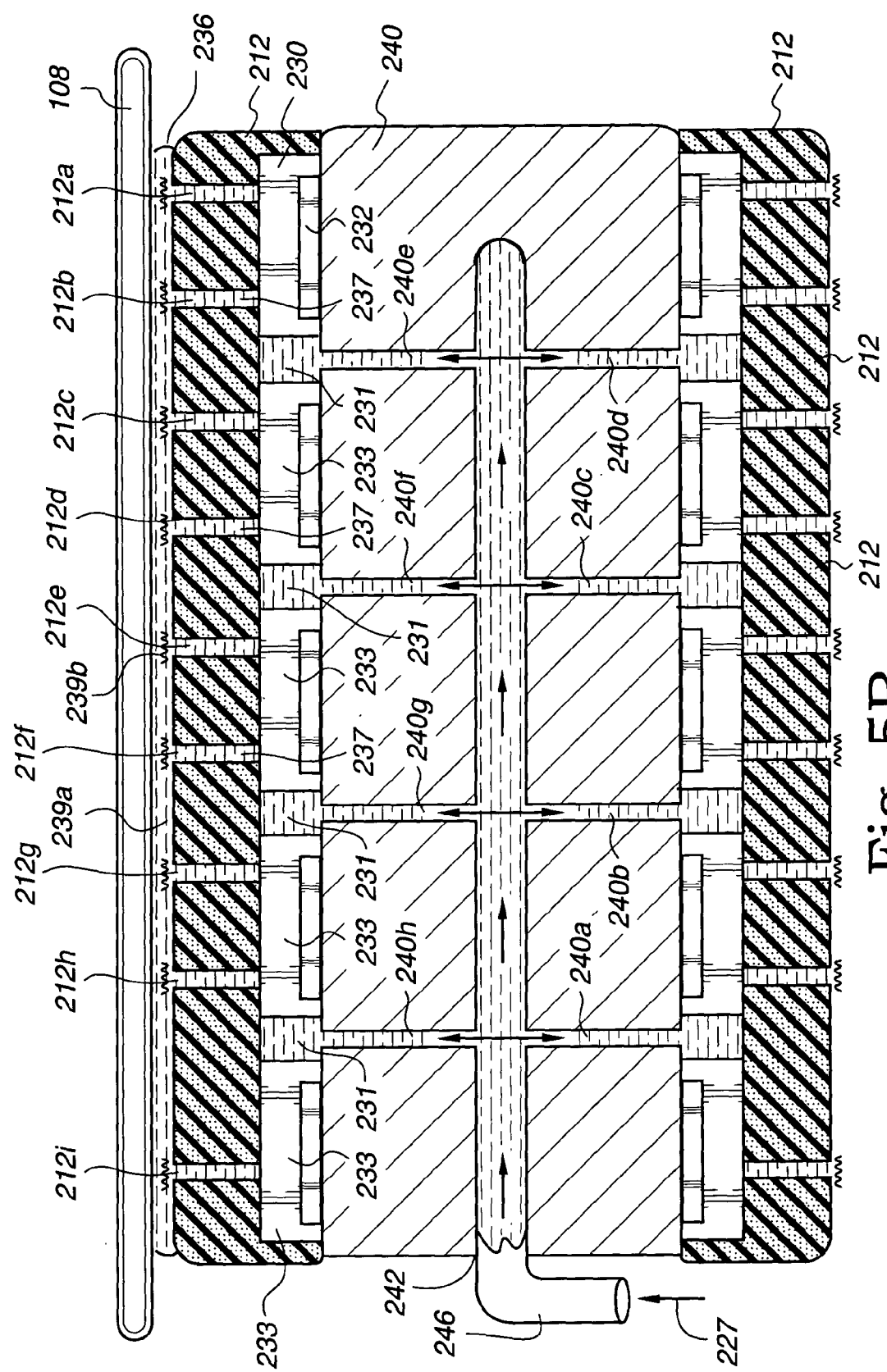
FIG. 5B is a simplified cross sectional view or the roller-type brush scrubbing-AE cleaning assembly being applied to the top surface of the wafer, in accordance with still another embodiment of the invention.

The cleaning operation using the roller-type brush scrubbing-AE cleaning assembly 200a can further be understood with respect to the simplified, exploded, cross sectional view shown in FIG. 5B, in accordance with one embodiment of the present invention. In the embodiment shown in FIG. 5B, the roller-type brush scrubbing-AE cleaning assembly 200b is being applied to the top surface of the wafer 108. The roller-type brush scrubbing-AE cleaning assembly is shown to include the brush core 240, the fluid inlet 246, and a plurality of transducers 233, each including crystals 232 and respective resonators 230, and the brush 212. Each crystal 232 of the plurality of crystals 232 is bonded to a face of a respective resonator 230, on the first side, and is attached to the brush core 240, on the second side. In one example, the brush 212 is configured to be disposed over the brush core 240 such that the resonators 230 are entirely covered by the brush 212. In this manner, the face of each resonator 130 is bonded to the corresponding crystal 132 while the back of each resonator 130 is in contact with the brush 212. The plurality of openings such as 212a–212i is defined in the brush 212 so as to facilitate traveling of AE.

A plurality of orifices 240a–240h is defined in the brush core 240. The fluid medium 227 is shown to be initially introduced into the brush core 240 through the fluid inlet 246. Thereafter, the fluid medium 227 is guided to the respective gaps 231 defined between each pair of adjacent resonators 232, and ultimately into the brush 112 and the openings such as 212a–212i.

In the embodiment of FIG. 5B, the roller-type brush scrubbing-AE cleaning assembly cleans the wafer as follows: The fluid medium 227 is implemented to saturate the brush 212 and form a meniscus 236 on the wafer top surface 108a. The fluid medium 227 is guided to the brush 212 and thus the wafer surface 108 first through the orifices 240a–240e and then the nearby gaps 231. In this manner, while the brush 212 is applied to the wafer top surface 108a with pressure, extra fluid medium 227 in the brush 212 is squeezed out as excess fluid 237 into the openings 212a–212i. In this embodiment, saturation of the brush 212 further leads to formation of the layer of meniscus 236 on the wafer surface. The meniscus 236 and the excess fluid 237 facilitate the transmission of AE to the wafer surface during the cleaning operation.

The application of the brush 212 onto the wafer top surface 108a using the fluid medium 227 enables mechanical cleaning of the wafer top surface 108a, thus defining areas 239. In this manner, contaminants defined on the planer surface of the wafer top surface 108a can easily be removed by brush scrubbing. Embodiments of the present invention, however, simultaneously clean the wafer top surface 108a using high frequency acoustic energy imparted from the resonators 232 to the wafer top surface 108a through the excess liquid 237 defined in the exemplary openings 212a–212i. The AE cleaning areas are shown as areas 239b. The high frequency acoustic energy cleaning can be implemented to dislodge contaminants defined deep within the topography features, substantially enhancing the cleaning operation performed by brush scrubbing.

Figure 5C:
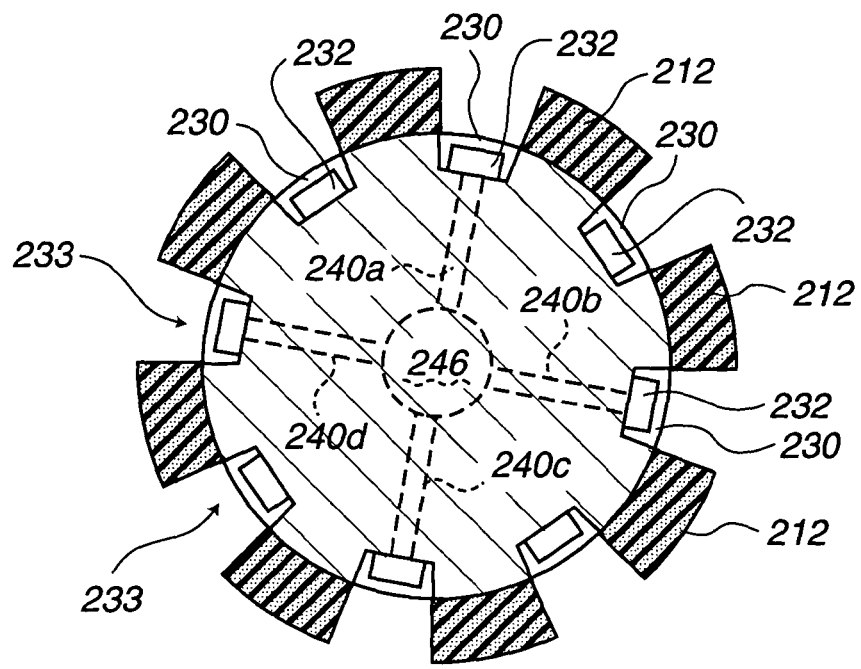
FIG. 5C is a simplified cross sectional view of an exemplary roller-type brush scrubbing-AE cleaning assembly, in accordance with still another embodiment of the invention.

FIG. 5C is a simplified cross sectional view of an exemplary roller-type brush scrubbing-AE cleaning assembly, in accordance with one embodiment of the present invention. As can be seen, the plurality of transducers 233, as shown by the resonators 232 and the brush 212 are disposed on the outer surface of the brush core 240 in an alternate arrangement. That is, each pair of transducers 233 is separated by at least a portion of brush 212. In this manner, the high frequency acoustic energy imparted by the resonators can easily travel through the small openings 212 and onto the wafer top surface 108a. As can be appreciated, each of the plurality of orifices 240a–240d is in contact with a portion of the brush 212, introducing fluid medium 227 into the cleaning interface through the brush 212. In one example, excess fluid medium 227 further creates the layer of meniscus on the wafer surface. In this manner, the high frequency acoustic energy imparted by the resonators 232 can travel through the fluid medium 227 in the exemplary openings 212a–h and the meniscus 236 on to the wafer surface.

Figure 5D:
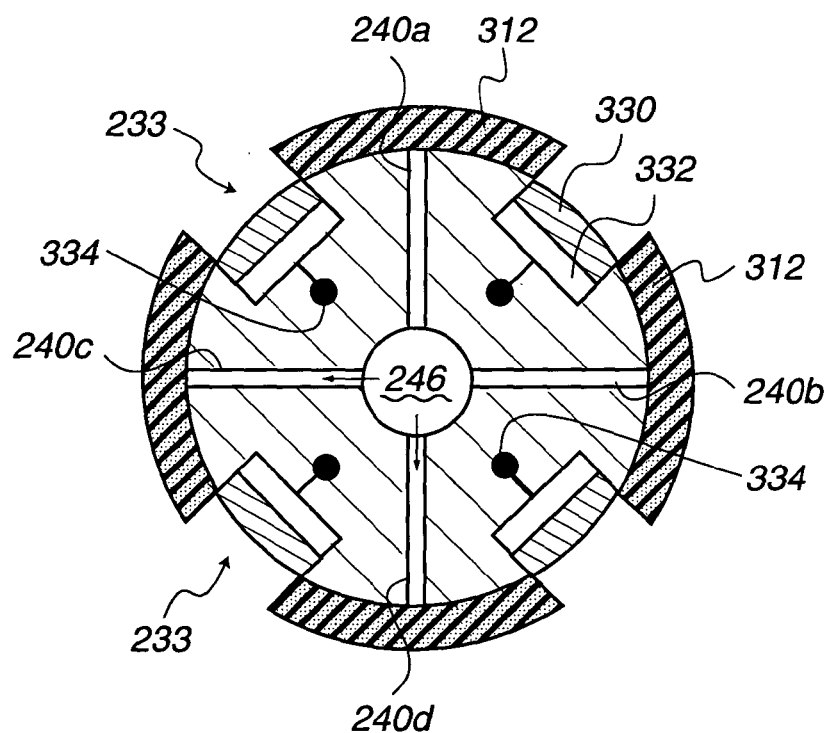
FIG. 5D is a simplified, exploded, cross sectional view of yet another exemplary roller-type brush scrubbing-AE cleaning assembly, in accordance with still another embodiment of the invention.

FIG. 5D is a simplified, exploded, cross sectional view of yet another exemplary roller-type brush scrubbing-AE cleaning assembly, in accordance with another embodiment of the present invention. In the embodiment of FIG. 5D, each of the plurality of crystals 332 is shown to be electrically connected to a electrical connection 332. As can be seen, the plurality of resonators 232 and brush 312 are dispose on the outer surface of the brush core 240 in an alternate arrangement. In this manner, power can be integrated in the brush core to be provided to the transducers. By powering the crystals 232 using the electrical connections 334, high frequency acoustic energy can be generated.

In one embodiment, the transducers 233 can cover substantially the entire outer surface of the brush core 240. In another embodiment, the transducers 233 can be defined on the outer surface of the brush core 240 such that transducers 233 cover less than an entire surface of the brush core 240. In such an embodiment, the openings 212a–212i defined in the brush 312 can be configured to merely cover the transducers rather than the entire surface of the brush core. Furthermore, as can be appreciated, a length of the transducers can be configured to be equivalent to the diameter of the wafer 108.

Figure 5E:
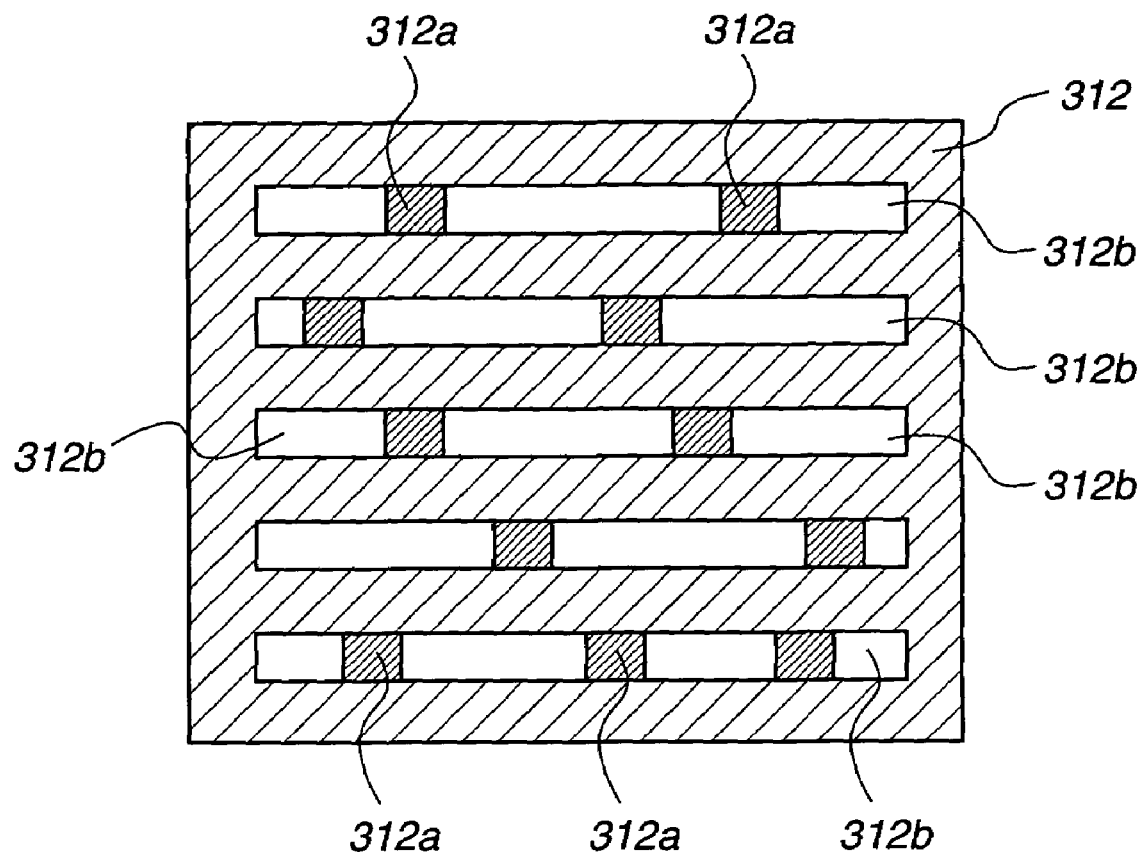
FIG. 5E is a simplified top view of an unrolled exemplary roller-type brush, in accordance with one embodiment of the present invention.

In one exemplary embodiment, a brush 312 can include a plurality of slits 312a and brush patches 312b, in accordance with one embodiment as shown in FIG. 5E. The embodiment of FIG. 5E illustrates an unrolled exemplary roller-type brush 312. As shown, the brush 312 includes a plurality of slits 312b, with each slit 312b including a plurality of brush patches 312a. In one preferred embodiment, each slit 312b is configured to be disposed over the brush core 240 such that each of the brush slits 312 is defined over a transducer. The brush patches 312a are configured to improve the strength of the brush 312, substantially reducing the possibility of having a tear in the brush 312. One must appreciate that the brush patches are defined out of phase. In this manner, lack of generation of acoustic energy resulting form being covered by each of the brush patches 312 is compensated by the adjacent transducers.

Figure 6:
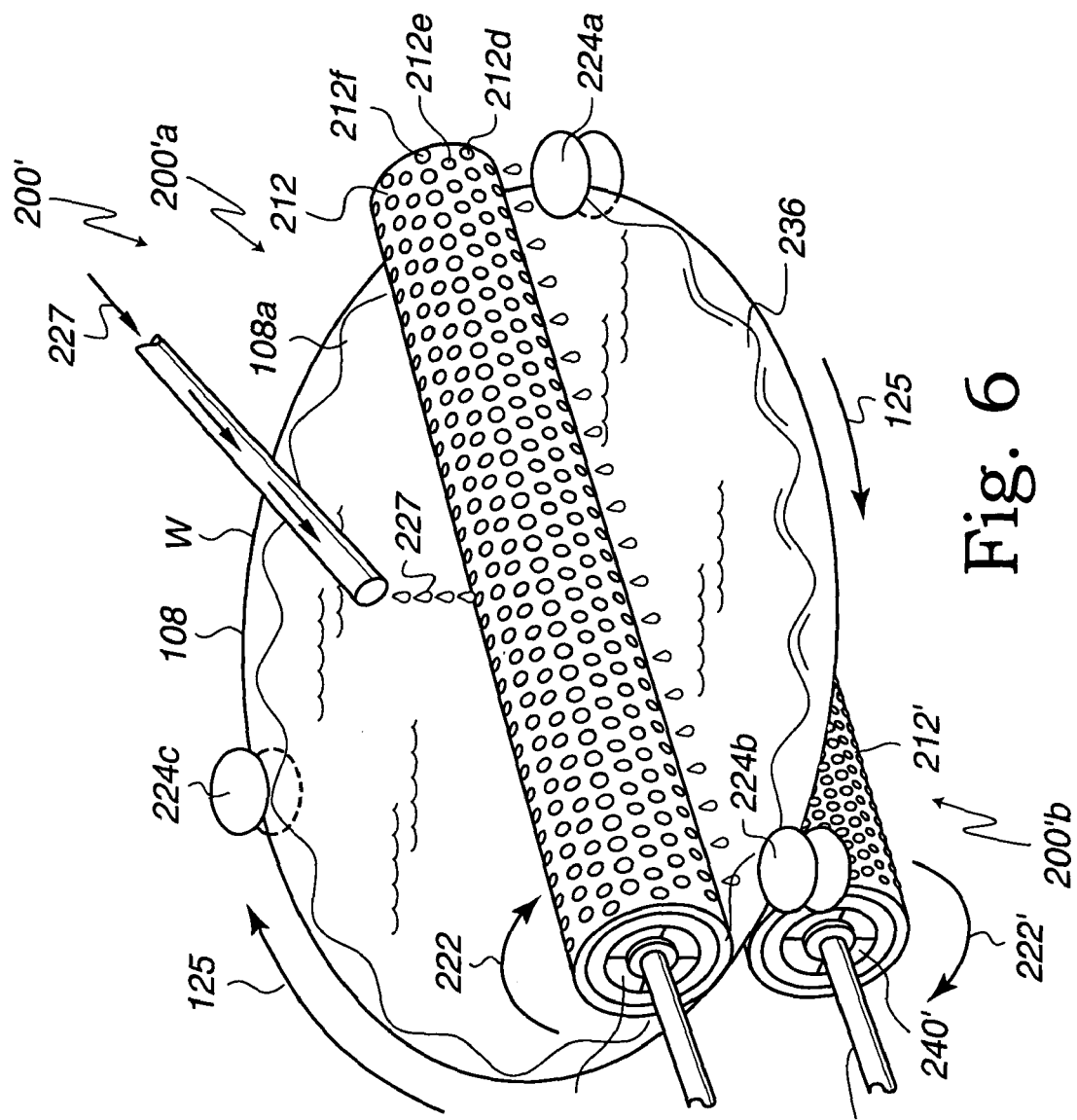
FIG. 6 is a simplified three-dimensional view of a pair of exemplary roller-type brush scrubbing-AE cleaning assemblies, in accordance with still another embodiment of the present invention.

FIG. 6 is a simplified three-dimensional view of a pair of exemplary roller-type brush scrubbing-AE cleaning assemblies 200'a and 200'b, in accordance with one embodiment of the present invention. As shown, fluid medium 227 is introduced onto the brush 212 and the wafer top surface 108a through a top nozzle 226. In this manner, fluid medium 227 is dripped onto the brush 212, saturating the brush 212 while creating a meniscus on the wafer top surface 108a. The fluid medium 227 defined in the exemplary openings 212a–h of the brush 212 enables the high frequency acoustic energy to travel and be applied on the wafer top surface 108a. In this manner, the wafer top surface 108a is cleaned by substantially concurrently using both mechanical action and the generated high frequency acoustic energy.

In accordance with one implementation, the wafer backside 108b of the wafer 108 can be cleaned using a bottom roller-type brush scrubbing-AE cleaning assembly 200'b. Similar to the top assembly 200'a, in one embodiment, the fluid medium 227 is sprayed onto the wafer backside 108b using a pressurized nozzle 226b (not shown in this Figure).

Figure 7:
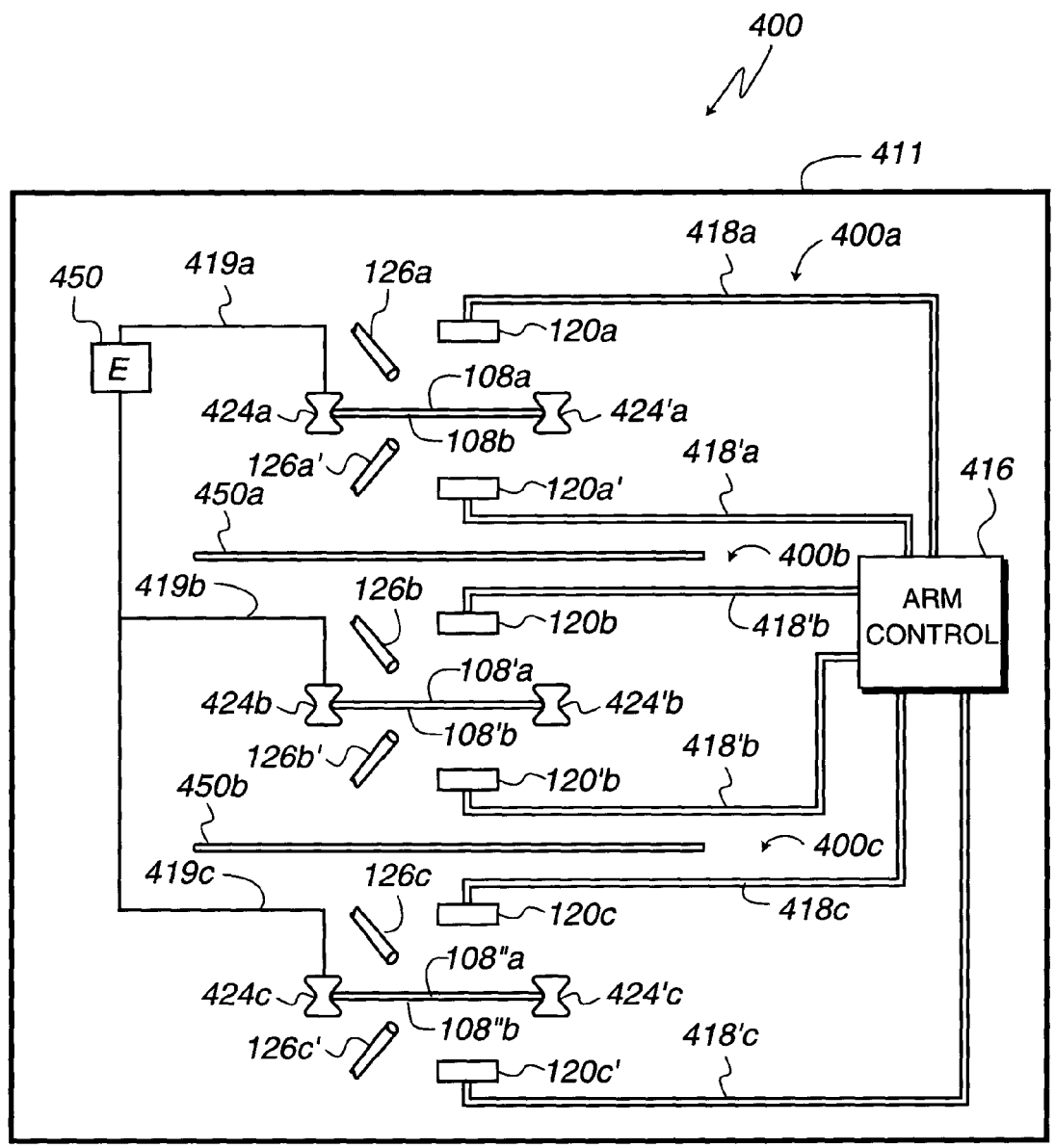
FIG. 7 is a simplified cross sectional view of an exemplary multi-station cleaning module including a plurality of single-wafer combination cleaning assemblies, in accordance with yet another embodiment of the present invention.

FIG. 7 is a simplified cross sectional view of an exemplary multi-station cleaning module 400 including a plurality of single-wafer combination cleaning assemblies 400a–400c, in accordance with one embodiment of the present invention. As can be seen, the cleaning module 400 includes a chamber 411, an arm control module 416, and an electrical connection module 450. The first single-wafer combination cleaning assembly 400a includes top and bottom brush-scrubbing-AE cleaning assemblies 120a and 120a', each connected to the arm control module 416 using a respective arm 418a and 418'a. The wafer 108 is engaged by a pair of rollers 424a and 424'a, each connected to the electrical connection module 450. Nozzles 126a and 126a' are configured to respectively spray fluid medium onto the wafer top and bottom surfaces 108a and 108b. The fluid medium introduced into the cleaning interface is configured to create a layer of meniscus on the wafer surfaces 108a and 108b and to saturate the brushes in the brush-scrubbing cleaning assemblies 120a and 120'a. As described in more detail above, the high frequency acoustic energy can easily travel through the fluid medium, allowing the acoustic energy imparted by the resonators to be applied on to the wafer surfaces.

Still referring to FIG. 7, the second single-wafer combination cleaning assembly 400b includes a top and bottom brush-scrubbing-AE cleaning assemblies 120b and 120b', each connected to the arm control module using a respective arm 418b and 418'b. The wafer 108' is engaged by a pair of rollers 424b and 424'b, each connected to the electrical connection module 450. Nozzles 126b and 126b' are configured to respectively spray fluid medium onto the wafer top and bottom surfaces 108'a and 108'b. The fluid medium introduced into the cleaning interface is configured to create a layer of meniscus on the wafer surfaces 108'a and 108'b and to saturate the brushes in the brush-scrubbing cleaning assemblies 120b and 120'b.

The third single-wafer combination cleaning assembly 400c includes a top and bottom brush-scrubbing-AE cleaning assemblies 120c and 120'c, each connected to the arm control module using a respective arm 418c and 418'c. The wafer 108" is engaged by a pair of rollers 424c and 424'c, each connected to the electrical connection module 450. Nozzles 126c and 126c' are configured to respectively spray fluid medium onto the wafer top and bottom surfaces 108"a and 108"b. The fluid medium introduced onto the cleaning interface is configured to create a layer of meniscus on the wafer surfaces 108"a and 108"b and to saturate the brushes in the brush-scrubbing cleaning assemblies 120c and 120'c.

As can be seen, each pair of adjacent single-wafer combination cleaning assemblies 400a–400c is separated by a shield 450a and 450b, respectively. In this manner, fluid medium introduced into each of the single-wafer combination cleaning assembly 400a–440c cannot contaminate the cleaning operation performed in the adjacent cleaning assemblies. Furthermore, several wafers, each made of different materials, can be cleaned substantially simultaneously in the multi-station cleaning module of the present invention. As can be appreciated, the embodiments of the present invention prevent the introduction of chemicals implemented in different single-wafer combination cleaning assembly to contaminate the adjacent stations. Of course, multiple wafers can be simultaneously cleaned implementing both a brush scrubber and high frequency acoustic energy, removing contaminants defined in the planer surfaces as well as deep topography features of the wafer.

Figure 8:
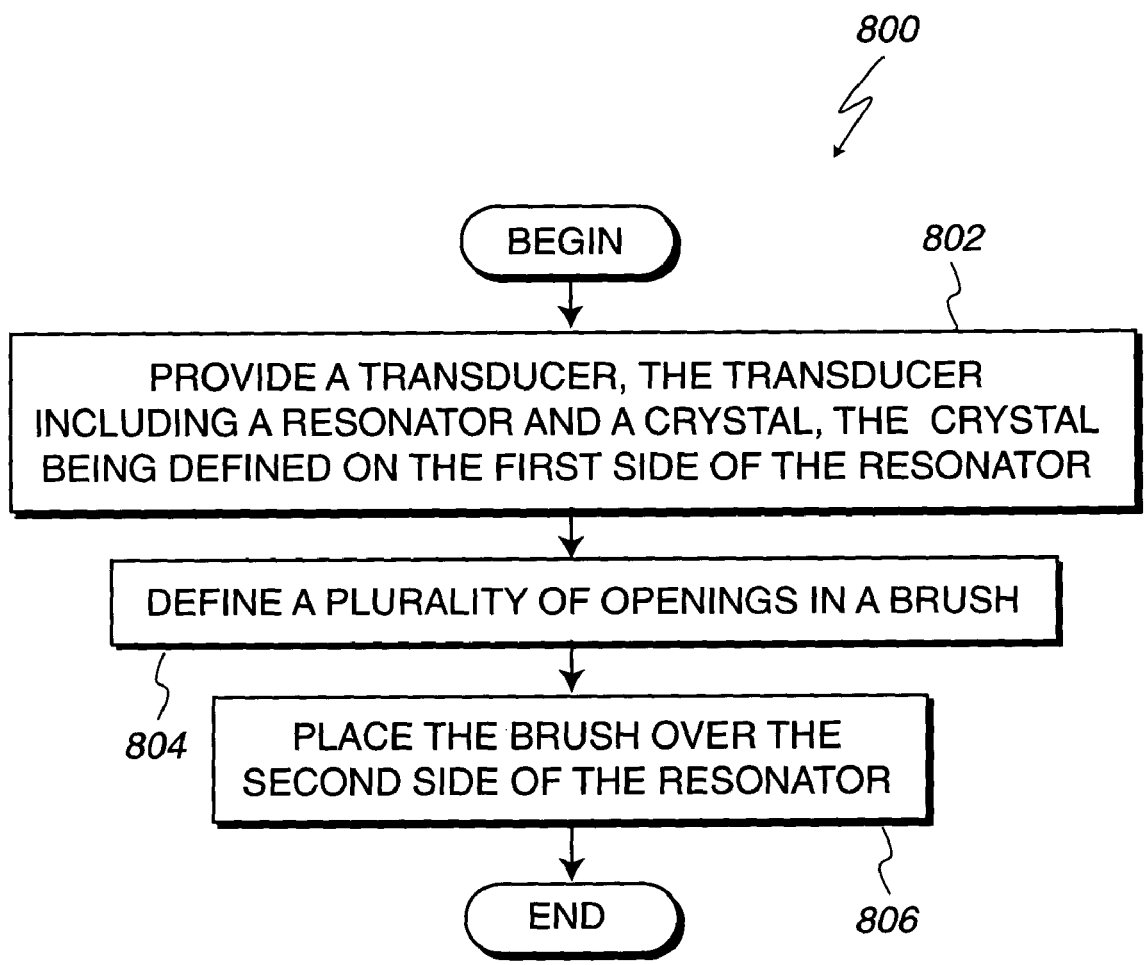
FIG. 8 is a flowchart diagram of method operations performed in making a brush scrubbing-AE cleaning assembly, in accordance with still another embodiment of the present invention.

FIG. 8 is a flowchart diagram 800 of method operations performed in making a brush scrubbing-AE cleaning assembly, in accordance with one embodiment of the present invention. The method begins in operation 802 in which a transducer is provided. The transducer includes a resonator and a crystal. The crystal is defined on the first side of the resonator. The method continues to operation 804 in which a plurality of openings is defined in a brush. In one embodiment, the brush is a flat brush. In one embodiment, the plurality of openings can perform the function as nodules during the cleaning operation. Next, in operation 806, the brush is placed over the second side of the resonator.

FIG. 9 is a flowchart diagram 900 of method operations performed in making a roller-type brush scrubbing-AE cleaning assembly, in accordance with another embodiment of the present invention. The method begins in operation 902 in which a brush core is provided followed by operation 904 in which a plurality of orifices is defined in the brush core. Continuing to operation 906, a plurality of transducers is defined on the brush core. Thereafter, in operation 908, each transducer is defined on the brush core without covering all of the orifices in the brush core. In one embodiment, the entire outer surface of the brush core can be covered by transducers. In such scenario, the brush can cover the entire outer surface of the brush core. In another embodiment, transducers are defined on certain portion of the brush core. In such embodiment, openings are defined on the sections of the brush configured to be disposed on the transducers. Proceeding to operation 910, a brush having a plurality of openings is provided. In operation 912, the brush is defined over the brush core and the transducers such that the openings in the brush are defined at least partially on the transducers.

It should be appreciated that the brush scrubbing-high frequency acoustic energy cleaning assembly of the present invention can be implemented to clean wafer surfaces vertically or horizontally. Additionally, although the embodiments described herein have been primarily directed toward cleaning semiconductor substrates, it should be understood that the brush scrubbing-AE cleaning assembly of the present invention is well suited for cleaning any type of substrate. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A substrate cleaning apparatus, comprising:
a transducer capable of resonating at a high frequency; and
a brush material attached to a surface of the transducer, the brush material including at least one passage extending to the surface of the transducer, the brush material being configured to be applied to a surface of the substrate, the transducer when resonating at the high frequency being capable of imparting acoustic energy to the surface of the substrate at a location of the at least one passage.

2. A substrate cleaning apparatus as recited in claim 1, wherein the brush material is saturated with a fluid.

3. A substrate cleaning apparatus as recited in claim 2, wherein the imparted acoustic energy is communicated through the fluid that resides in the at least one passage.

4. A substrate cleaning apparatus as recited in claim 2, wherein the fluid is applied to the brush material through a nozzle.

5. A substrate cleaning apparatus as recited in claim 4, wherein a substantially uniform meniscus layer of fluid covers the surface of the substrate.

6. A substrate cleaning apparatus as recited in claim 1, wherein the brush is a flat brush.

7. A substrate cleaning apparatus as recited in claim 6, wherein a shape of the transducer is one of a circular, a quarter-arc length of a circle, and an eight-arc length of a circle.

8. A substrate cleaning apparatus, comprising:
a plurality of transducers capable of resonating at a high frequency; and
a brush material attached to surfaces of the transducers, the brush material including at least one passage extending to the surface of each transducer of the plurality of transducers, the brush material being configured to be applied to a surface of the substrate, wherein each transducer of the plurality of transducers is configured to resonate at the high frequency so as to impart acoustic energy onto the surface of the substrate at a respective location of each at least one passage extending to the surface of each transducer.

9. A substrate cleaning apparatus as recited in claim 8, wherein the brush material is saturated with a fluid.

10. A substrate cleaning apparatus as recited in claim 9, wherein acoustic energy imparted by the plurality of transducers is communicated with the surface of the substrate through the fluid residing in each at least one passage extending to the surface of each transducer of the plurality of transducers.

11. A substrate cleaning apparatus as recited in claim 9, wherein the fluid is applied to the brush material through a nozzle.

12. A substrate cleaning apparatus as recited in claim 11, wherein a substantially uniform meniscus layer of fluid covers the surface of the substrate.

13. A substrate cleaning apparatus as recited in claim 8, wherein the brush is a flat brush.

14. A substrate cleaning apparatus as recited in claim 13, wherein a shape of each transducer is one of a circular, a quarter-arc length of a circle, an eight-arc length of a circle.

15. A substrate cleaning apparatus as recited in claim 8, wherein the brush is a roller brush.

16. A substrate cleaning apparatus as recited in claim 15, wherein a shape of each transducer is one of a circular, a rectangle, and a square.

17. A substrate cleaning apparatus, comprising:
a plurality of transducers capable of resonating at a high frequency, each transducer including a crystal and a resonator, the resonator having a frontside and a backside, the crystal being defined on the backside of the resonator; and
a brush material attached to the frontside of each resonator, the brush material being a porous material, the brush material including at least one passage extending to the frontside of each resonator of the plurality of resonators, the brush material configured to be applied onto a surface of the substrate, wherein each transducer of the plurality of transducers is configured to resonate at the high frequency so as to impart acoustic energy onto the surface of the substrate at a respective location of each at least one passage extending to the frontside of the resonator of each transducer.

18. A substrate cleaning apparatus as recited in claim 17, wherein acoustic energy imparted by the plurality of transducers is communicated with the surface of the substrate through a fluid residing in each at least one passage extending to the frontside of each resonator of each transducer of the plurality of transducers.

19. A substrate cleaning apparatus, comprising:
a transducer capable of resonating at a high frequency, the transducer including a crystal and a resonator, the resonator having a frontside and a backside, the crystal being defined on the backside of the resonator; and
a brush material attached to the frontside of the resonator, the brush material being a porous material, the brush material including at least one passage extending to the frontside of the resonator, the brush material being configured to be applied onto a surface of the substrate, the transducer when resonating at the high frequency being capable of imparting acoustic energy onto the surface of the substrate at a location of the at least one passage.

20. A substrate cleaning apparatus as recited in claim 19, wherein the brush material is saturated with a fluid, and further wherein the imparted acoustic energy is communicated through the fluid that resides in the at least one passage.

* * * * *